United States Patent
Li et al.

(10) Patent No.: US 6,437,558 B2
(45) Date of Patent: *Aug. 20, 2002

(54) PASSIVE SOLID-STATE MAGNETIC FIELD SENSORS AND APPLICATIONS THEREFOR

(75) Inventors: Yi-Qun Li, Tewksbury; Robert C. O'Handley, Andover; Gerald F. Dionne, Winchester, all of MA (US); Chun Zhang, Warren, NJ (US)

(73) Assignee: Spinix Corporation, Moraga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/810,088

(22) Filed: Mar. 16, 2001

Related U.S. Application Data

(62) Division of application No. 09/441,763, filed on Nov. 17, 1999, now Pat. No. 6,279,406, which is a continuation of application No. 09/358,177, filed on Jul. 20, 1999.
(60) Provisional application No. 60/094,837, filed on Jul. 31, 1998.

(51) Int. Cl.[7] .............................. G01P 3/48; G01P 3/54
(52) U.S. Cl. .......................................... 324/174; 310/328
(58) Field of Search ................................ 324/174, 209, 324/207.13, 244, 117 R; 73/861.77, 861.08; 310/328, 323, 339

(56) References Cited

U.S. PATENT DOCUMENTS

| | | | |
|---|---|---|---|
| 3,909,809 A | 9/1975 | Kinsner et al. | 340/174 TF |
| 4,499,515 A | 2/1985 | Piotrowski et al. | 360/113 |
| 4,528,502 A | 7/1985 | Rocha | 324/117 |
| 4,769,599 A | 9/1988 | Mermelstein | 324/244 |
| 4,887,032 A | 12/1989 | Hetrick | 324/207 |
| 4,936,508 A | 6/1990 | Ingalz | 239/72 |
| 5,130,654 A | 7/1992 | Mermelstein | 324/244 |
| 5,675,252 A | * 10/1997 | Podney | 324/244 |
| 5,821,658 A | 10/1998 | Boggs, III | 310/105 |
| 6,279,406 B1 | * 8/2001 | Li et al. | 73/861.77 |

FOREIGN PATENT DOCUMENTS

GB  2 188 157 A  9/1987  .......... G01R/33/02

OTHER PUBLICATIONS

M.D. Mermelstein, "A Magnetoelastic Metallic Glass Low–Frequency Magnetometer," *IEEE Transactions on Magnetics*, vol. 28, No. 1 (Jan. 1992).

S.T. Vohra, et al., "Fiber–Optic DC and Low–Frequency Electric–Field Sensor," *Optics Letters*, vol. 16, No. 18 (Sep. 15, 1991).

M.D. Mermelstein, et al., "Low–Frequency Magnetic Field Detection with a Magnetostrictive Amorphous Metal Ribbon," *Appl. Phys. Lett.* 51(7) (Aug. 17, 1987).

* cited by examiner

*Primary Examiner*—Edward Lefkowitz
*Assistant Examiner*—Subhash Zaveri
(74) *Attorney, Agent, or Firm*—Hamilton, Brook, Smith & Reynolds, P.C.

(57) ABSTRACT

Passive solid-state magnetic sensors are based on the combination of magnetorestrictive materials and piezoelectric materials. Sensors have applications in motor speed detection, magnetic field detection, read heads, and MRAM, for example.

15 Claims, 16 Drawing Sheets

ANTIPARALLEL POLARIZATION

PARALLEL POLARIZATION

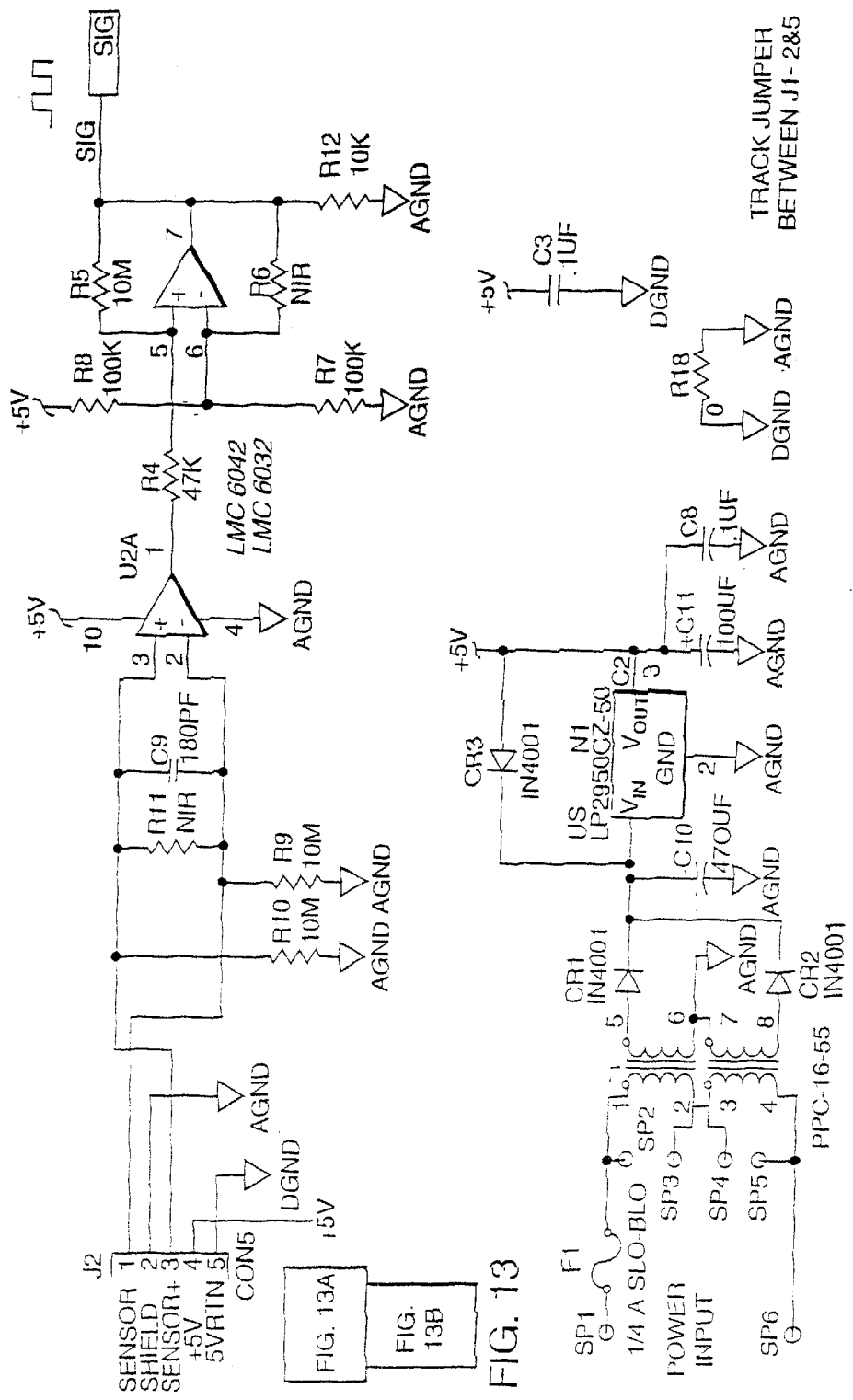

PASSIVE SOLID-STATE MAGNETIC FIELD SENSORS AND APPLICATIONS THEREFOR

RELATED APPLICATIONS

This application is a Division of U.S. application Ser. No. 09/441,763, filed Nov. 17, 1999, now U.S. Pat. No. 6,279,406, which is a Continuation of U.S. application Ser. No. 09/358,177, filed Jul. 20, 1999, and which claims the benefit of U.S. Provisional Application No. 60/094,837, filed Jul. 31, 1998. The contents of the above applications are incorporated herein by reference in their entirety.

BACKGROUND OF THE INVENTION

1. Technical field

This invention is in the field of magnetic sensors which detect a magnetic field or magnetic field change and find use in linear or rotary motion detection, electrical current sensing, linear or rotary position sensing, magnetic imaging, magnetic recording read heads, magnetic recording media as well as general magnetic field sensing.

2. Background of the Invention

Because of the many applications of magnetic field sensors, there is a long history of technical development of materials and means to measure fields of various strengths. No one sensor can perform every function well. Factors such as size, weight, power consumption, and cost should be minimized by a field sensor. Sensitivity, linearity, bias, stability, reliability, and operating temperature and frequency range are factors that should be optimized. As with any instrument, it is usually difficult to achieve all of these characteristics in one device. The most common magnetic sensors used in a variety of applications are the Hall effect sensor and the variable reluctance coil. The drawback of variable reluctance devices is that they generate signals proportional in size to the time rate of change of magnetic flux. The signal size therefore decreases with decreasing speed, and below a certain flux change rate, the signal disappears into the noise. Hall effect devices generate a very small raw signal because of low field sensitivities (0.5_5 mV/100 Oe applied field). This mandates signal conditioning, and requires that a certain minimum field be available for device operation.

The concept in combining the magnetostrictive materials and piezoelectric layers for highly sensitive magnetometer was first introduced by Mars D. Mermelstein in 1986. In his patents U.S. Pat. No. 4,769,599 and U.S. Pat. No. 5,130,654 a magnetometer is disclosed as a device using a piezoelectric resonator to create a standing wave in a sensing magnetostrictive ribbon and using a pickup coil to read out the electromotive force. A minimum detectable field gradient of 7.7 pT/cm-Hz was achieved in this device by using a differential amplifier technique. In October 1997, a device called piezomagnetometer was patented by Walter N. Pondney. In that device a stack of 201 alternating piezoelectric and magnetostrictive layers is used, in which 100 pairs of piezoelectric-magnetostrictive layer capacitors are connected electrically in parallel to increase the charge storage by raising the effective capacitor plate area. The device requires multiple layers that are placed in a permanent biasing magnetic field normal to the layer surface. A resolution as high as 1 pT/cm-Hz is achieved.

SUMMARY OF THE INVENTION

Our invention represents a new technology of passive solid-state magnetic sensors based on a combination of magnetostrictive material and piezoelectric material.

The innovative sensors can be mass produced at low cost in comparison with any existing magnetic sensor technologies including variable reluctance coils, Hall-effect devices, magnetoresistance semiconductors, and the most recently developed giant magnetoresistance (GMR) metal multilayers. Such a magnetostrictive/piezoelectric sensor does not consume any electrical power and easily has a field sensitivity larger than 10 mV/Oe. The devices including digital speed meter, digital flow meter, and digital electrical current meter have been demonstrated as application examples of the inventive sensors.

The combination of piezoelectric and magnetostrictive layers has not yet been used for the general applications of magnetic sensors. The present invention is basically a device that has two magnetostrictive layers and one piezoelectric layer or two piezoelectric layers and one magnetostrictive layer. Three-layer devices can be connected electrically in series to increase the voltage by raising capacitor plate separation. The sensors are designed for general magnetic field detection purposes in applications ranging from speed, flow, and electrical current detection to the information storage and imaging. The advantages of the inventive sensors over the competitive technologies are passive solid-state, high field sensitivity, wide dynamic range up to several thousands of Oersted, and low-cost in manufacturing.

Generally, the present invention uses a piezoelectric material in contact with a magnetostrictive material. The magnetostrictive component strains in response to presence of a magnetic field. This strain couples to the piezoelectric material, causing this material to produce an electrical output signal. The main objective of the invention is to provide an innovative, low cost and highly sensitive magnetic sensor of the simplest design, which requires no electrical power for the sensing element. The sensitivity of the device and the operating magnetic field range can be adjusted through material properties and structure designs for a variety of applications. The important variables used in the design include 1) selecting magnetostrictive materials with appropriate properties, 2) selecting piezoelectric materials with optimal properties, 3) determining the optimal number of capacitive elements, 4) selecting the appropriate thickness of each layer, 5) designing the geometry of the structure, and 6) establishing the most efficient bonding and packaging methods. The inventive magnetic sensors can be widely used in replacement of Hall-effect sensors, variable reluctance coils, and magnetoresistive devices. The particular applications of the inventive magnetic sensors are (a) speed detection and controls for rotary machines including automobiles, airplanes, locomotives, etc., (b) flow meters for reading and controls of liquid or gas flows, (c) electrical current meters for reading and controls of electrical power usage, and (d) micromagnetic field sensors for magnetic recording/reading heads and magnetic imaging devices.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 13, 13a and 13b are schematics of a microprocessor-based electrical circuit design for the passive solid-state magnetic sensors used in the motion detection according to the invention.

DETAILED DESCRIPTION OF THE INVENTION

We have discovered an efficient way to incorporate a magnetostrictive material with a piezoelectric material to produce a magnetic field sensor and designed a suitable electrical circuit for impedance matching and signal amplifying. The principle of such a sensor is that a strain is induced in a magnetostrictive element when it is exposed to a magnetic field sufficient to change the direction of magnetization. This magnetostriction strain is then transferred into the adjacent piezoelectric element to which it is bonded. The piezoelectric element, in turn produces an electrical signal output.

Single Element With Magnetostrictive Metal

Figure 1A:
FIGS. 1a–1c are schematics of the basic structures of the passive solid state magnetic sensors according to the invention.
Figure 1B:
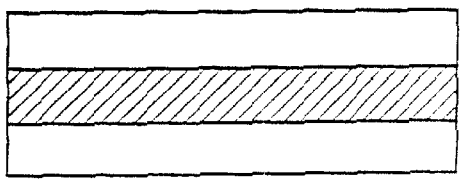
Figure 1C:
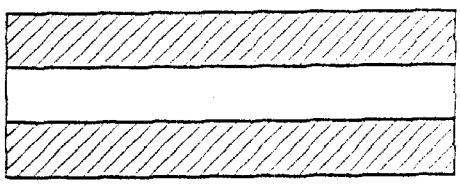

FIGS. 1a–1c illustrate embodiments of the invented magnetic sensor. The structure of FIG. 1a is a basic two-layer sensor containing one piezoelectric layer and one magnetostrictive layer. Structure of FIG. 1b is comprised of two structure-A sensors; here the magnetostrictive layer will strain simultaneously on both sides of piezoelectric layers. Structure of FIG. 1c is also comprised of two structure-A sensors; here the two magnetostrictive layers will strain simultaneously on both sides of a piezoelectric layer. The thickness of individual element and the total number of elements comprising the structure can be optimized for different applications.

Structure of FIG. 1c is preferred for most of the applications since this structure is more rugged and more cost effective. In these structures, the electrical signal is produced by the strain generated at the interfaces of magnetostrictive and piezoelectric layers by a magnetic field without involving the bending of the structure, which provides a good mechanical stability. By expanding the separation for high voltage and reducing surface areas, multiple sensors can be readily connected in planar geometry. This concept is particularly appreciated if the magnetostrictive element is an insulator such as, a ferrite.

Figure 2:
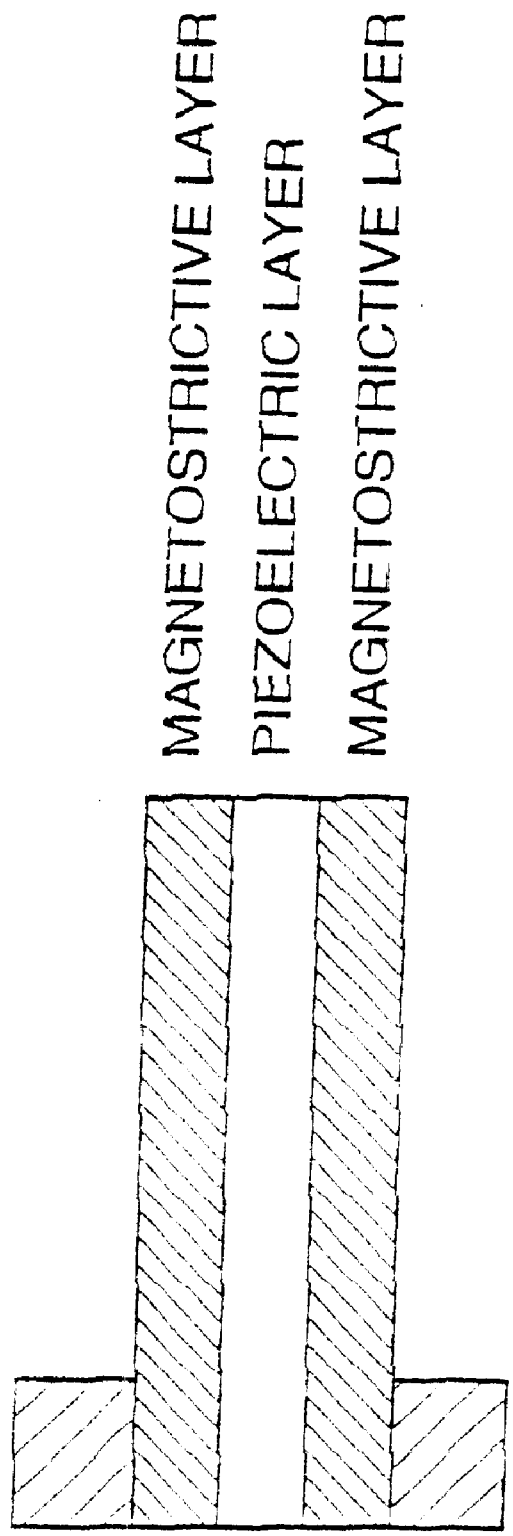
FIG. 2 is a schematic of the cantilever structure of the passive solid state magnetic sensor according to the invention.

The use of cantilevers is a common method of amplifying mechanical motion to enhance the strain induced in a piezoelectric or magnetostrictive material. This is shown in FIG. 2. In this case a bimorph structure of two piezoelectric layers with one magnetostrictive layer in the middle is preferred and the two piezoelectric layers are poled in orthogonal directions so that the stresses in the two piezoelectric layers due to bending are in opposite directions. Although this cantilever design produces a larger signal, the structure of FIG. 1c is found to have sufficient sensitivity for most of the applications.

A soft magnetic material is one in which the direction of magnetization M is readily changed by a modest applied field (H<100 Oe). The simplest effect that governs the orientation of magnetization in a soft magnetic material in the absence of an external field is sample shape. The magnetization vector preferably assumes an orientation, which minimizes the number of magnetic poles appearing on the sample surface. Thus M lies along the longest sample dimension and avoid orientations normal to the largest area surfaces. This magnetostatic effect can be used to advantage to design a sensor with a preferred quiescent state of magnetization. Thus a piece of soft magnetic material in ribbon, sheet or thin film form will be magnetized in the longer of the in-plane directions. A field transverse to this quiescent state will cause a rotation of the magnetization into the field direction. A 90° rotation of the magnetization causes the largest shape change in a magnetostrictive material. A field applied along the preferred axis of magnetization will produce only 180° domain wall motion, which does not change the state of strain of the magnetic material. Therefore, from the view of minimizing the demagnetizing field (increasing the effective magnetic field) in the sensor, the sensor is preferably placed with the longer side parallel to the sensing magnetic field, and from the view of maximizing the magnetostriction in the sensor, the sensor is preferably placed with short side parallel to the sensing magnetic field. The trade off has to be made when the sensor is designed.

The preferred direction of magnetization can also be controlled by magnetic field annealing. Annealing in a field of 100 Oe min at temperatures below the Curie temperature of the magnetic materials. The annealing temperature and time, alloy composition and $T_C$, cooling rate, and the strength of the field all affect the results obtained. The bias magnetic field can be also applied in certain direction to optimize the design.

Two factors have to be considered for selecting piezoelectric materials. The piezoelectric voltage constant g (Vm/N) determines the sensitivity of generating electrical voltage at a certain force or stress. The temperature coefficient of the g parameter determines the operation range of the sensors. Two material candidates which possess high g values are lead zirconate titanate (PZT=Pb($Zr_x Ti_{1-x}$)$O_3$) ceramics and polyvinylidene fluoride (PVDF) polarized polymers. The titanate ceramics have g values of 10–50 and a high electromechanical coupling coefficient K of 0.3–0.7. The PVDF polymers have higher g values, 200–300, but have lower values of K, 0.1–0.15. The major difference between these two materials is their respective dielectric constants. The titanate ceramics have relative dielectric constants $\in/\in_0$ that are about 100 times larger than the relative dielectric constants for the PVDF polymers. A useful figure of merit for the inventive sensor is proportional to $gK/\in$ so that the PVDF polymer has a much higher figure of merit than does titanate ceramic. However, the temperature instability of the PVDF polymer is much worse than the temperature instability of the titanate ceramic. Other piezoelectric materials, such as aluminum nitride (AlN) and quartz ($SiO_x$), having a figure of merit similar to that of the titanate ceramics can also be used for the inventive sensors. These three materials are a better choice for multilayer thin film sensors because of their deposition compatibility with the magnetostrictive metals.

The two major requirements on the magnetic material are:
1. A non-zero magnetostriction so that it strains upon being magnetized.
2. An anisotropy that allows the material to be saturated in a field of strength governed by the range of fields to be measured. This involves both the hysteresis properties of the material and its saturation magnetization value which influences anisotropy depending on shape of the material and direction of the magnetizing field.

For measuring very weak fields, a figure of merit is the ratio $$Q = E\lambda_s^2 / 2Ku$$

Q is maximized when the material gives the most strain in the weakest fields. Amorphous magnetic alloys can be field annealed to be greatest magnetized to saturation in fields below 10 Oe. In a material such as a-FeBSi ($\lambda_s \sim 35 \times 10^{-6}$, $M_s \sim 1400$ emu/$g_1$'), $E \sim 10^{12}$ d/$cm^2$, $K_u = M_s H_a/2 \sim 7 \times 10^3$ erg/$cm^3$, so $Q \sim 0.18$.

For a highly magnetostrictive material such as Terfenol-D, $E \sim 5 \times 10^{11}$ d/$cm^3$, $\lambda_s = 1750 \times 10^{-6}$, $M_s \sim 800$ emu/$cm^3$, $K_a \sim 1 - 4 \times 10^5$ erg/$cm^3$. Thus $$Q \sim 0.01$$

which is lower than that for the lower $\lambda_s$ material. However, Terfenol-D will be suitable for measuring larger field strengths.

Nickel and many iron-nickel alloys are good choices because both anisotropy and magnetostriction can be controlled over reasonably wide ranges. However, amorphous magnetic alloys remain the best choice for low field measurements because very low magnetic anisotropy can be achieved. Iron-cobalt alloy has a relative large magnetostriction and high saturation field. The magnetostriction of the annealed $Fe_{50}Co_{50}$ alloy can reach $150 \times 10^{-6}$ and the maximum $d\lambda/dH$ can be as high as $2 \times 10^{-6}$ per Ostered in comparison with $4 \times 10^{-6}$ for FeSiB amorphous ribbon and $0.04 \times 10^{-6}$ for Ni. The advantage of using FeCo alloy is that the linear range and the sensitivity of magnetostriction verses a magnetic field can be controlled by annealing process to meet a variety of applications.

B. Planar Piezomagnetic Design with Magnetostrictive Ferrite Substrate

Figure 3A:
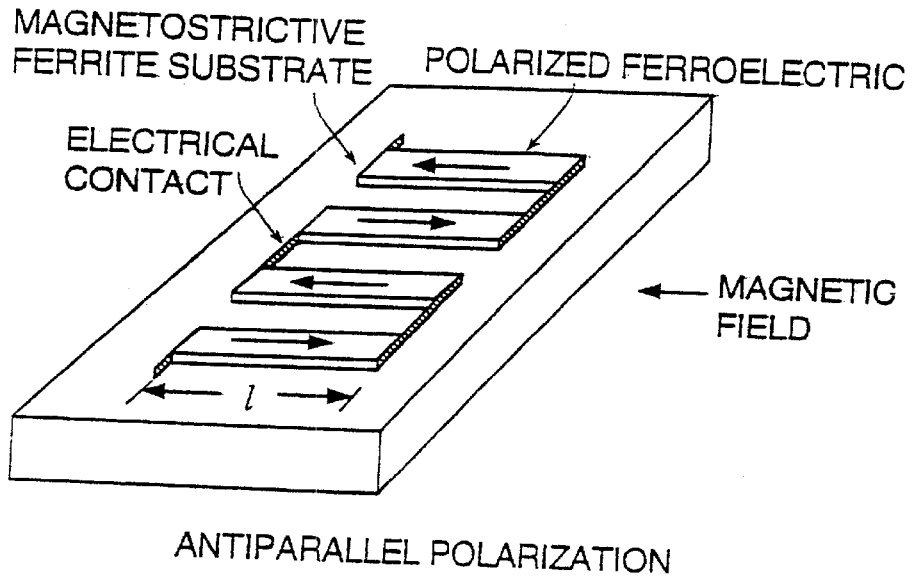
FIGS. 3a and 3b are schematics of planar piezoelectric design with magnetostrictive ferrite substrate according to the invention.
Figure 3B:
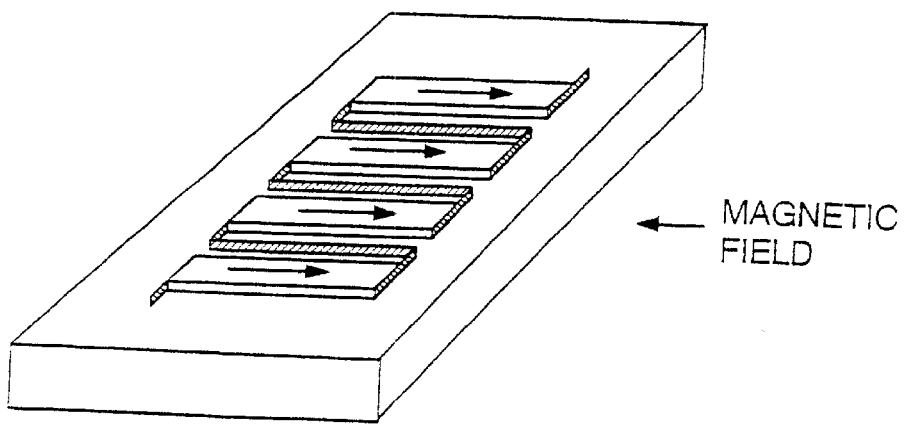

An alternative device structure is based on the use of a magnetostrictive insulator (ferrite). In combination with a piezoelectric, the ferrite can provide an efficient two-layer planar structure that lends itself to thin film processing and has the advantage of a high length to area ratio to give a small capacitance that permits high-frequency operation. In FIGS. 3a and 3b, a ferromagnetic material with magnetostrictive properties acts as a substrate for a pattern of parallel piezoelectric stripes of length l. As indicated, the piezoelectric stripes are electrically polarized (poled) into a ferroelectric state with an initial dielectric displacement bias, and are connected in series such that the polarization directions are continuously reinforcing.

FIG. 3a depicts the case of alternating pole directions and a simple connector scheme.

The arrangement in FIG. 3b is more complicated but offers the processing advantage of allowing the ferroelectric poling step to be delayed until after the device structure is completed.

One important benefit of ferrites is their high initial permeability and narrow hysteresis loop, which avoids the necessity of an external bias magnet. Although the magnetostrictive coefficients are more than a factor of ten smaller than the magnetostrictive coefficients for metallic materials, such a terfenol-D, ferrites such as NiZn spinel ferrite can have initial permeabilities more than a factor of one hundred greater. The effect of these magnetic parameters on piezomagnetic device performance can be deduced from the following relation for voltage sensitivity to magnetic field (which is analogous to the Q figure of merit):

$$dV/dH = (d/\in)(\lambda_s/H_K) cl \cos \theta$$

where c is Young's modulus. The key design parameter for the ferrite is the ratio of saturation magnetostriction constant $A_s$ to the magnetocrystalline anisotropy field $H_K$. In most ferrites, $H_K$ can be effectively canceled by cobalt additions. The key design parameter of the piezoelectric layer is the ratio of the relevant piezoelectric constant d to the corresponding dielectric permittivity $\in$. The key device design parameter for maximum voltage is the length l of the polarized stripe. All of these design parameters must be maximized for optimum sensitivity.

One further advantage of this planar device configuration is the large dynamic range of magnetic field sensing that can be achieved simply by adjusting the angle θ between the magnetic field vector and the plane of the ferrite substrate.

With hysteresis switching times of ferrites in the nanosecond range and the low capacitance resulting from small length to area ratios, application of these devices can be extended to the high-frequency sensing regime.

The principle of the generation of the electrical signal from the innovative sensor is based on the piezoelectric effect of ferroelectric or paraelectric materials. The sensor structure can be as electrically equivalent to a voltage source in series with a capacitor as a charge generator (current source) in parallel with a capacitor.

FIGS. 4a–4d show three basic circuit approaches for amplifying and reading the signal output from the sensors.

Figure 4A:
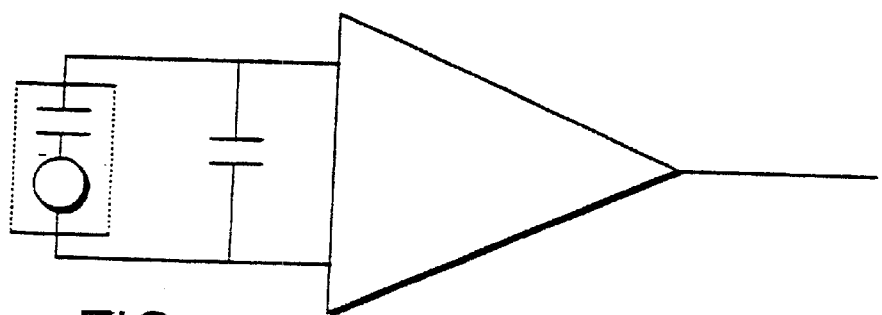
FIGS. 4a–4c are open-loop circuit designs for direct measurement of voltage generated by a piezoelectric magnetic sensor; and a closed-loop circuit designs for measurement of the charge change produced by a piezoelectric magnetic sensor according to the invention.
Figure 4B:
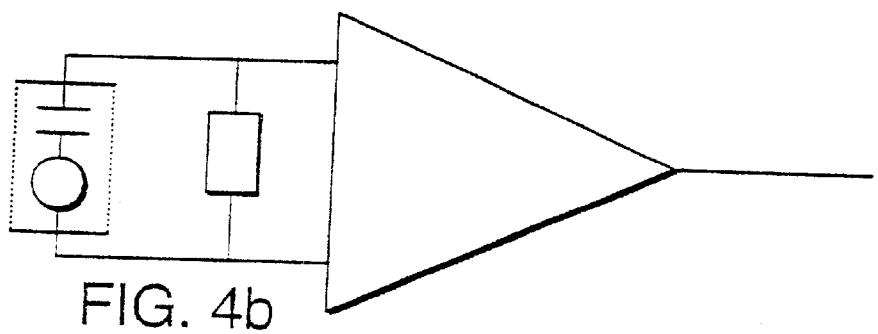
Figure 4C:
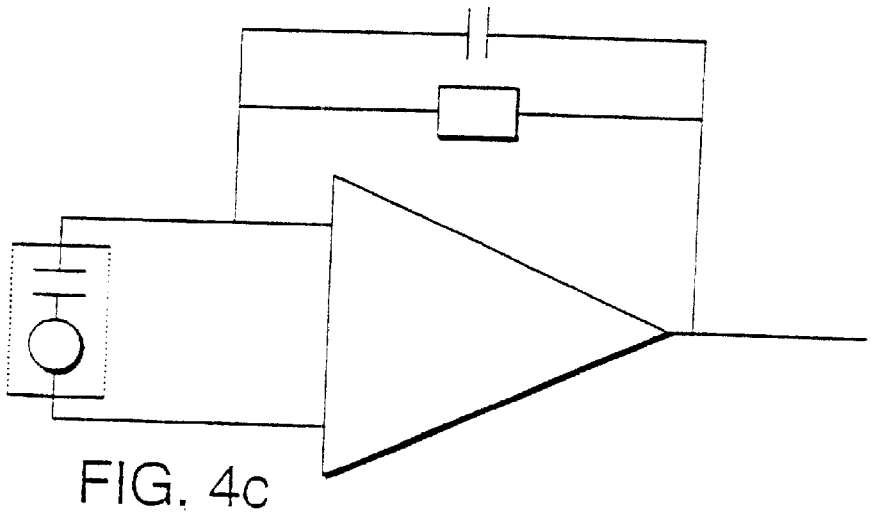

In the case of FIG. 4a the charge change in the sensor is directly measured as an open loop voltage by an operational amplifier with a high impedance and a low leakage current. In the case of FIGS. 4b and 4c the charge change in the sensor is measured as a current passing through a resistor in a closed loop circuit.

The circuit of FIG. 4a is preferred for the inventive sensors because the cut-off frequency (3 dB down) can be as low as $8 \times 10^{-5}$ Hz with 2 nF of sensor capacitance and 0.08 Hz with 2 pF of sensor capacitance if the input resistance of the operational amplifier and the sensor internal resistance are in a order of $10^{12}$ Ω. More importantly, the measured voltage with this circuit is independent of the area of the sensor, which allows a sensor with a miniature size, for example, for magnetic imaging and magnetic recording read heads. A unit gain follower with a picoamper electrometer amplifier AD546 (impedance as high as $10^{12}$ Ω), illustrated in FIG. 4d, was built to test sensors made from FeCo/PZT/FeCo three-layer structure. Frequency independence of the signal output after the cutoff frequency is confirmed in a sensor with a size of $2 \times 10$ mm$^2$ and a capacitance of 2 nF. The independence on area of the signal output is confirmed with a $2 \times 10$ mm$^2$ sensor and a $1 \times 5$ mm$^2$ sensor. The ratio of sensor width to sensor length was maintained the same to eliminate the difference of demagnetizing effect. The other useful characteristic of the circuit of FIG. 4a to measure the output of the sensor is that the output voltage is theoretically proportional to the thickness of the piezoelectric materials in this layered configuration, which has also been demonstrated by a comparison of two sensors made from different thicknesses of PZT plates; one plate is 200 $\mu$m thick, and the other plate is 500 $\mu$m thick. The signal of the 500 $\mu$m thick plate is twice as high as the signal for the 200 $\mu$m plate.

The thin-film devices based on a multilayer structure with alternating magnetostrictive layer and piezoelectric layer are important for reducing the sensor size and integrating with semiconductor IC circuits. Two potential applications are outlined as the following. A trilayer structure as shown in FIGS. 1b or 1c can be used to read the stored information on the recording media. The thickness of the devices can be designed as small as 300 Å to meet the requirement for the rapidly growing density of recording media. The advantages of these devices over the currently used MR or GMR technology include high sensitivity, high thermal stability, and no requirement for input power.

Figure 5C:
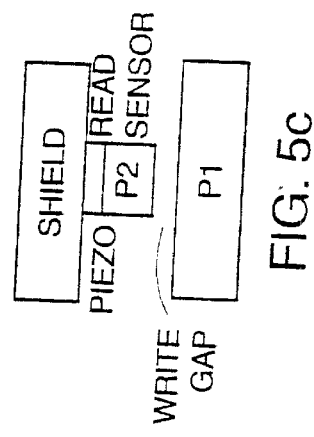
FIGS. 5a, 5b, 5c, 5d are schematics showing a piezoelectric magnetic read/write head according to several embodiments of the invention.
Figure 5B:
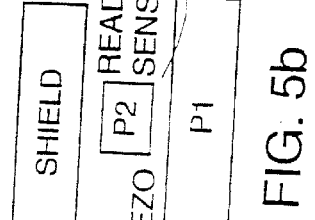
Figure 5A:
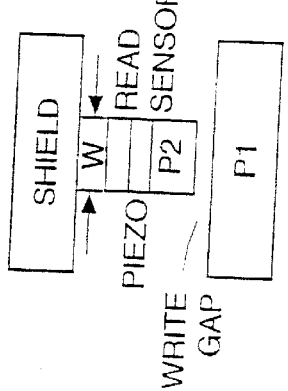
Figure 5D:
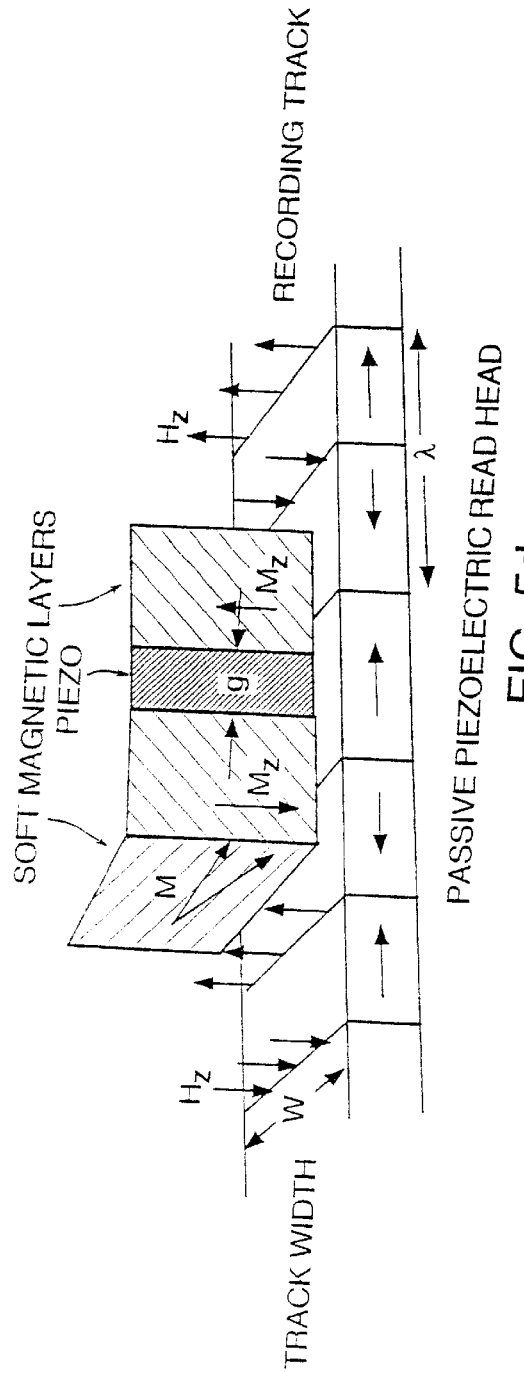

FIG. 5a shows the film structure having a central piezoelectric layer sandwiched by two soft magnetic layers of non zero-magnetostriction. The soft layers are processed (by field annealing or intrinsic stress from substrate) so that they are magnetized essentially parallel to the track width of the underlying bits. The thickness of the piezoelectric layer forms the read head gap, g, and must be less than about half a bit length: $g < \lambda/2$.

When the head is over a dibit ($\pm H_z$ separated by $\lambda/2$) the magnetization of one pole piece is tilted down from the horizontal and the other is tilted up. The magnetization change in the two layers results in a change in the state of strain of the piezoelectric layer and a voltage is induced in the piezoelectric layer. The induced voltage is read directly across the two metallic pole pieces. It does not matter whether the magnetization vectors in the two pole pieces are parallel or antiparallel to each other (the latter is more stable magnetostatically). In either case, the field above the recorded transition will result in a characteristic voltage across the piezoelectric layer. This voltage signal will differ in the parallel and antiparallel cases. The two pole pieces of the head can be set to one or the other state, whichever is optimal for the selected piezoelectric material and the characteristics of the recording medium. The ideal magnetic layer composition will have a weak cross track anisotropy and non-zero magnetostriction (e.g. $Ni_{76}Fe_{24}$ or $Fe_{50}Co_{50}$). The coercivity of these layers should be minimal.

It is also possible to integrate the write head into this read head structure by making one of the read pole pieces of a high flux density material ($Fe_{50}Co_{50}$). The piezoelectric layer will still be strained to produce a voltage during the read process. The read/write head must be shielded and one of the shields provides a low reluctance return path for the write process. Three possible constructions for read heads that are integrated with an inductive write head are shown in FIG. 5b. The view in each case is of the "air bearing surface", i.e. the end of the recording head looking up from the medium along the z direction. In all cases, the piezoelectric layer thickness defines the read gap, d(gap). The insulation between the shields and the other metallic layers is typically alumina.

In the configuration of FIG. 5a, the read sensor is fabricated between two much thicker shield layers. The lower shield serves as a return flux path for the write process, P1. The bits are written across the write gap, with one of the read pole pieces being of a high flux density material and also serving as the other write pole piece, P2. The track width, w, is defined by P2. In the configuration of FIG. 5b, the lower shield serves both as P1 and as one of the read pole pieces. Thus the read and write gaps are both defined by the thickness of the piezoelectric layer. Again P2 defines the track width. In configuration (c), the read and write gaps are again separated.

It is possible also to make use of the benefits of passive piezoelectric sensing of different magnetic states in MRAM-like devices for nonvolatile information storage. We describe one embodiment here.

In a non-volatile MRAM, writable memory cell is a trilayer of soft-magnetic/metallic spacer/semihard magnetic films. The information is written and stored in the semihard layer. The readout is done by sensing the spin valve resistance across the trilayer in two states of magnetization for the soft or free layer. Because the soft and semihard layers have different coercivities, the resistance changes as a function of field as shown at the lower left of the figure. Fields greater than $H_{c2}$ are required to write information (one of two stable states of magnetization) in the semihard layer. A field of magnitude between $H_{c1}$ and $H_{c2}$ changes the state of magnetization in the free layer without altering the written bit. When the free layer magnetization is changed, the sense of the resistance change across the device indicates the state of magnetization in the storage layer. The fields are applied with a cross pattern of conductors that also leave to locate the address of each bit. While spin-valve based MRAM has many advantages, it does draw current and the signal is proportional to the sense current. It may also be frequency limited by eddy current losses in the leads and switching times in the magnetic layers.

Figure 6A:
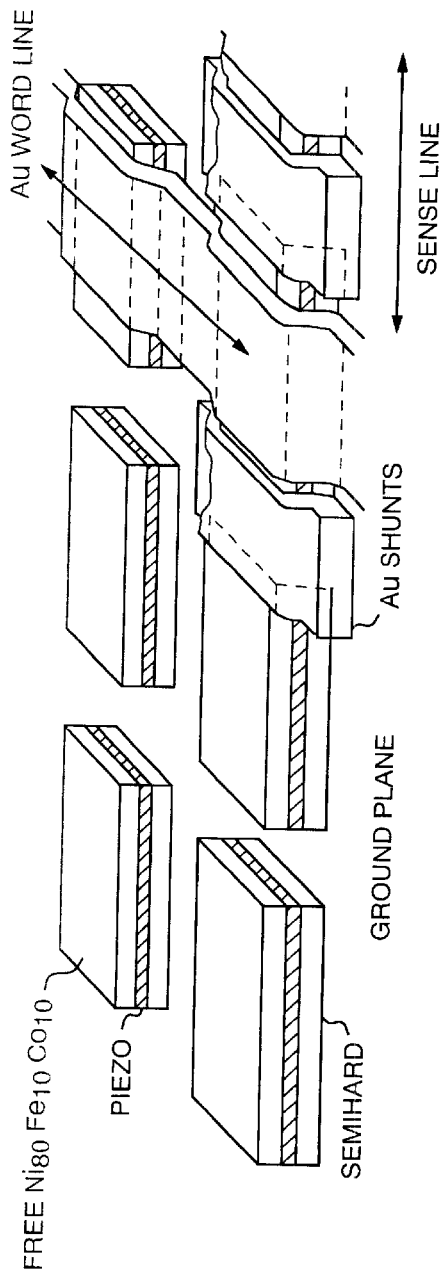
FIGS. 6a–6c show a passive piezoelectric magnetic random access memory (PMRAM) showing simplified view of trilayer magnetic/piezo/magnetic elements at left and conductors at right. The passive voltage measured across the spin valve is depicted at the lower left. A cross section of the main elements of the device is shown at lower right according to the invention.
Figure 6C:
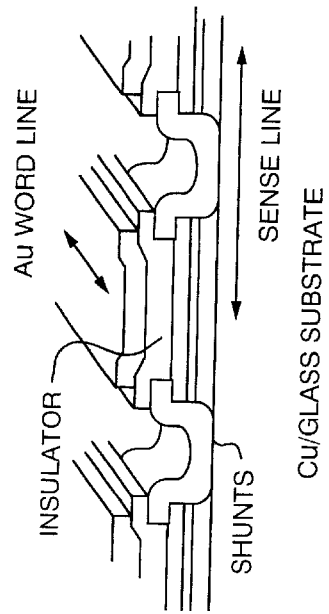
Figure 6B:
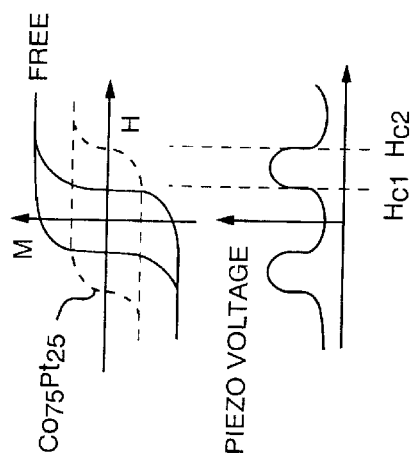

By simply replacing the Cu layer with a piezoelectric layer as shown in FIG. 6, the need for a sense current is removed. When the state of magnetization is the same in the two magnetic layers, the piezoelectric layer will be in one state of strain (depending on the magnetostriction and thickness of the two adjacent layers). When the state of magnetization is different in the two magnetic layers, the piezoelectric layer will be in a different state of strain. These different states of strain will be reflected in the voltage across the piezoelectric layer which we have demonstrated to be appreciable and readily measured. This voltage is read at the x-y address of the bit as in a spin-valve MRAM but there is no need to power the device by putting a current through it. There are significant advantages to this piezoelectric-MRAM (P-MRAM) in terms of speed, signal-to-noise ratio, and power consumption relative to an all metal MRAM. In addition, it may also add to the lifetime and reliability of the devices because issues of metallic interdiffusion across two metallic interfaces are obviated by the presence of a stable oxide material. A variety of other soft and semihard magnetic materials which have significant magnetostriction could be used instead of the ones illustrated in the figure above. In addition, there are a great many piezoelectric materials that can be chosen based on material compatibility, signal to noise, reliability and so on. The shunts, word lines and sense lines can also be made of conductors other than Au.

Figure 7:
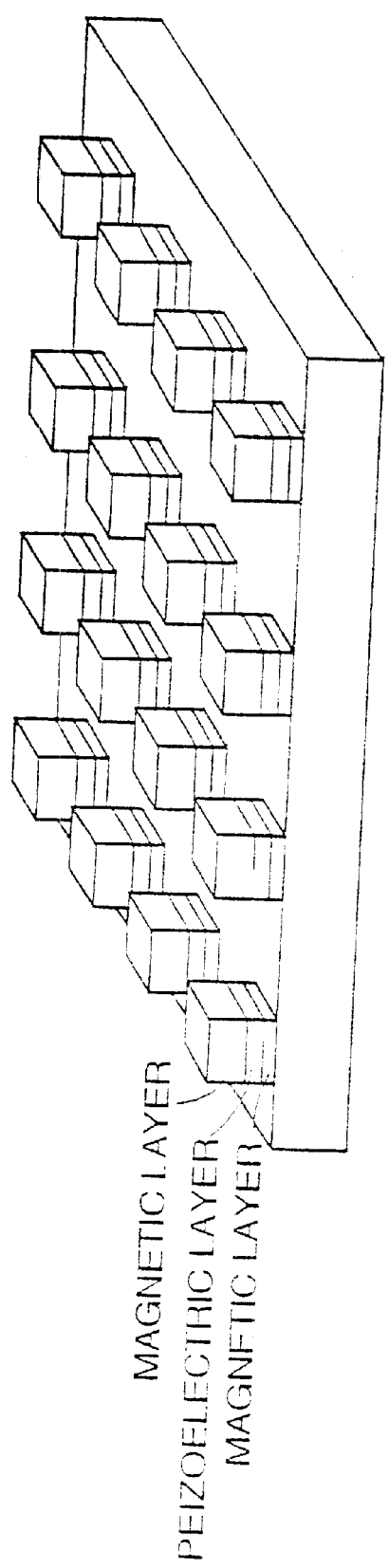
FIG. 7 is a schematic of two dimensional piezoelectric magnetic sensor array for magnetic imaging according to the invention.

Two dimensional, as schematically shown in FIG. 7 or one dimensional multilayer sensor arrays can be made for direct magnetic field imaging. The developed readout integrated circuits for ultrasonic imaging and pyroelectric IR imaging can be applied here for detection of the electric charge change in piezoelectric layer caused by a magnetic field change through magnetostrictive layer. The readout circuit will be directly integrated with the magnetic sensor array on a semiconductor wafer. Such a device will be useful for inspection of magnetic materials including recording disks, medical imaging or for high speed recording read head array.

EXAMPLE 1

Figure 8:
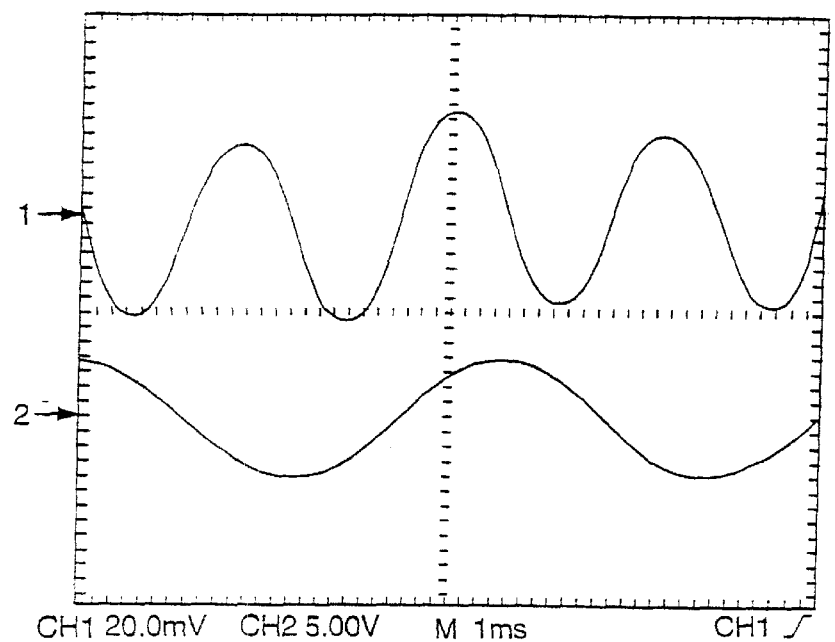
FIG. 8 shows the signal output (upper trace) of a structure-B sensor when an ac magnetic field (lower trace) is applied according to the invention.
Figure 9:
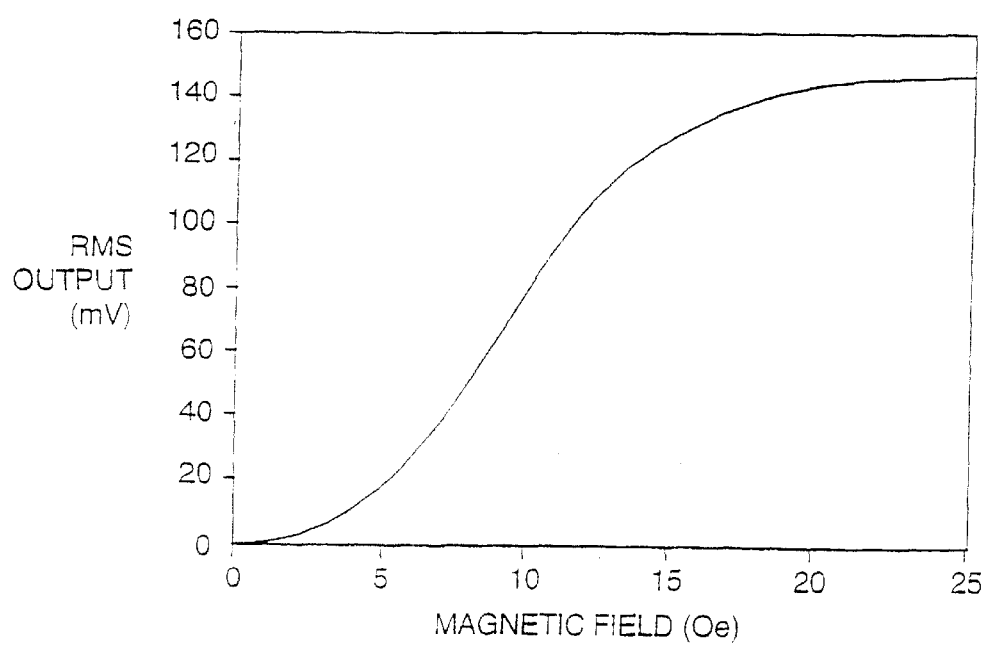
FIG. 9 shows the RMS of a signal output from a structure-B sensor as a function of the peak value of an ac magnetic field.
Figure 10:
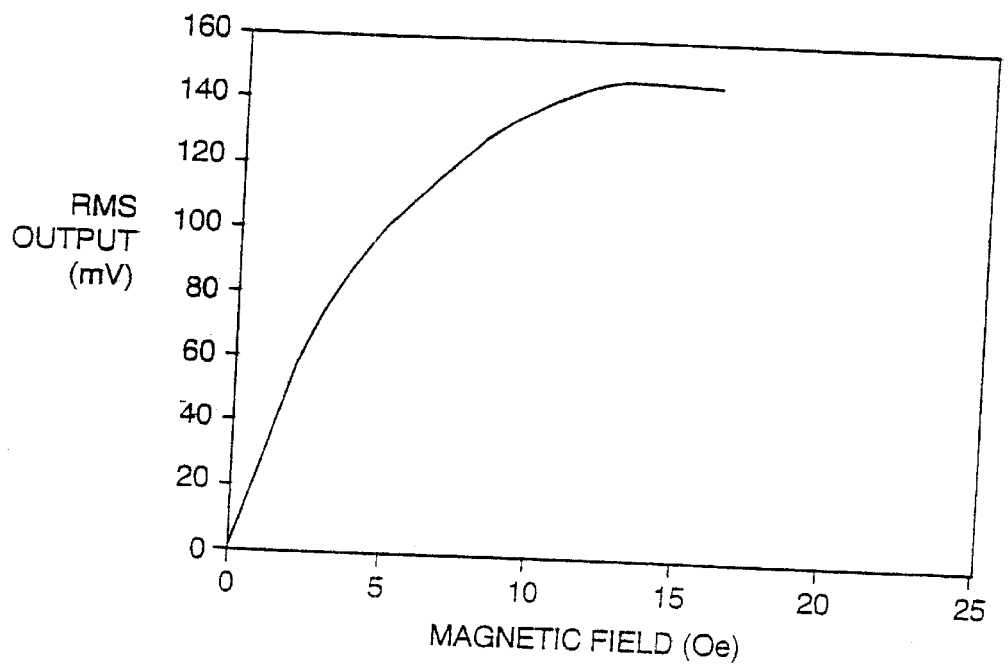
FIG. 10 shows the RMS of a signal output from a structure-B sensor biased at 12 Oe as a function of the peak value of an ac magnetic field.

A sample of piezoelectric lead zirconate titanate (PZT) ceramic sheet (2"×3"×150 $\mu$m thick) was first cut into one centimeter square pieces. A magnetic amorphous alloy (FeNiMoSiB) ribbon with a thickness of 30 $\mu$m was also cut into one-centimeter square. A sandwich structure as in FIG. 1b was made by gluing a magnetic alloy layer in the middle with two PZT layers outside using conducting silver epoxy. The two PZT layers were oriented with the same electric pole direction. Two electric leads were soldered to the sandwich, one on the top surface and one on the bottom surface as shown in FIG. 1b. The sample was placed in an ac magnetic field and the two electrical leads were connected to an oscilloscope. FIG. 8 shows a response signal output (upper trace) with peak to peak signal of 90 mV. The ac magnetic field (lower trace) shows amplitude of 10 Gauss. The double frequency of the output signal with respect to that of the magnetic field is due to the quadratic dependence of magnetostriction on magnetic field: e $\lambda_s$ (cos$^2$−⅓) $\lambda_s$[(H/H$_a$)$^2$−⅓]. The RMS output signal measured as a function of the magnetic field is shown in FIG. 8. The linear range of the output signal is from 5 to 15 Oe and the signal is saturated when the field is over 25 Oe. The magnetic field sensitivity of the sample over linear range is approximately 5 mV/Oe as calculated from the curve in FIG. 9. The same measurement was performed on the sample in the presence of a DC bias magnetic field of 12 Oe. The signal output now has the same frequency as the drive frequency of the magnetic field as long as the amplitude of the magnetic field is smaller than the bias magnetic field of 12 Oe. The RMS output signal is plotted as a function of the magnetic field in FIG. 10. A magnetic field sensitivity of at least 20 mV/Oe is obtained in this case.

EXAMPLE 2

Figure 11:
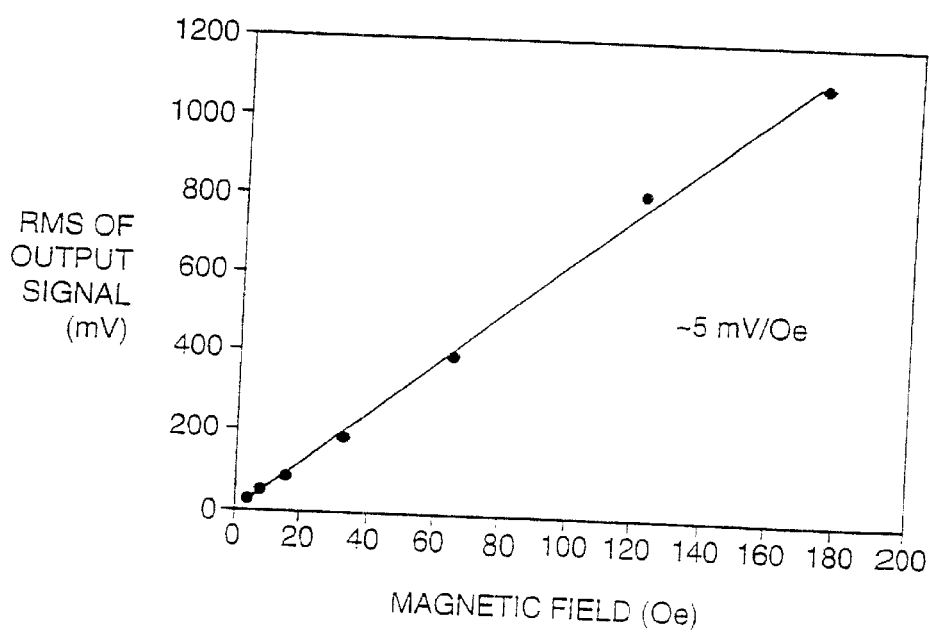
FIG. 11 RMS of a signal output from a structure-C sensor using $Fe_{50}Co_{50}$ as a function of the peak value of an ac magnetic field.

In this example two 3"×4"×50 $\mu$m Fe$_{50}$Co$_{50}$ sheets (as-rolled) and one 3"×4"×175 $\mu$m PZT plate were glued together to form the structure C as shown in FIG. 1 by a manufacturing process provided by Morgan Matroc, Inc. located at Bedford, Ohio. 200 pieces of 2 mm×10 mm sensors were made by dicing the 3"×4" glued wafer. The sensitivity of the selected samples was tested to show a good uniformity. Using a ⅛"×¼" NdFeB magnet placed at one end of the sensor serving as a bias magnetic field, these sensors have the sensitivity of 5 mV RMS signal per Oe and a large linear range as shown in FIG. 11.

EXAMPLE 3

Figure 12:
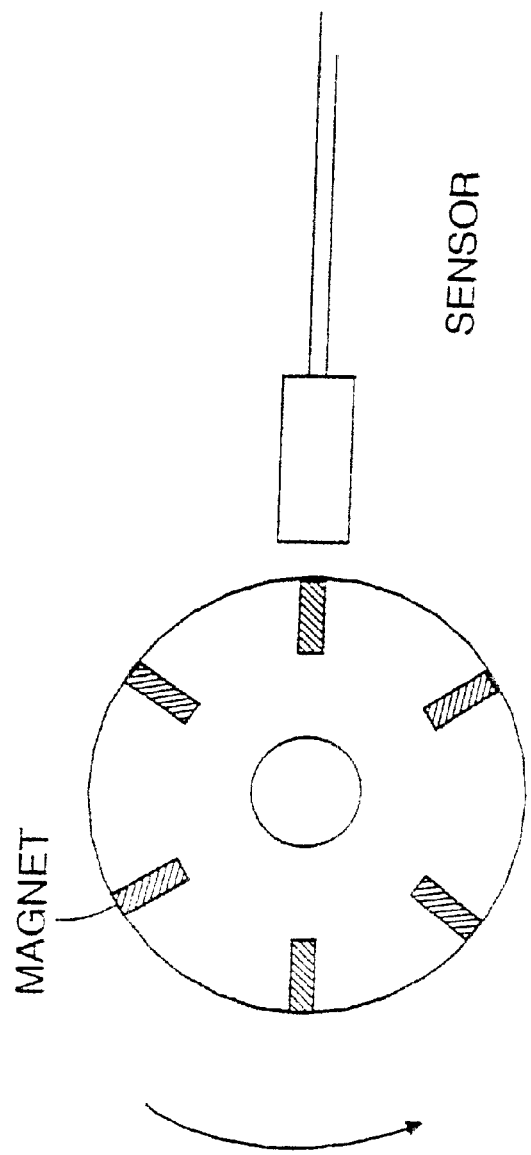
FIG. 12 shows the passive solid-state magnetic sensor used for detecting the rotating speed of a plate with six micro magnets mounted on the edge in equal distance according to the invention.
Figure 13B:
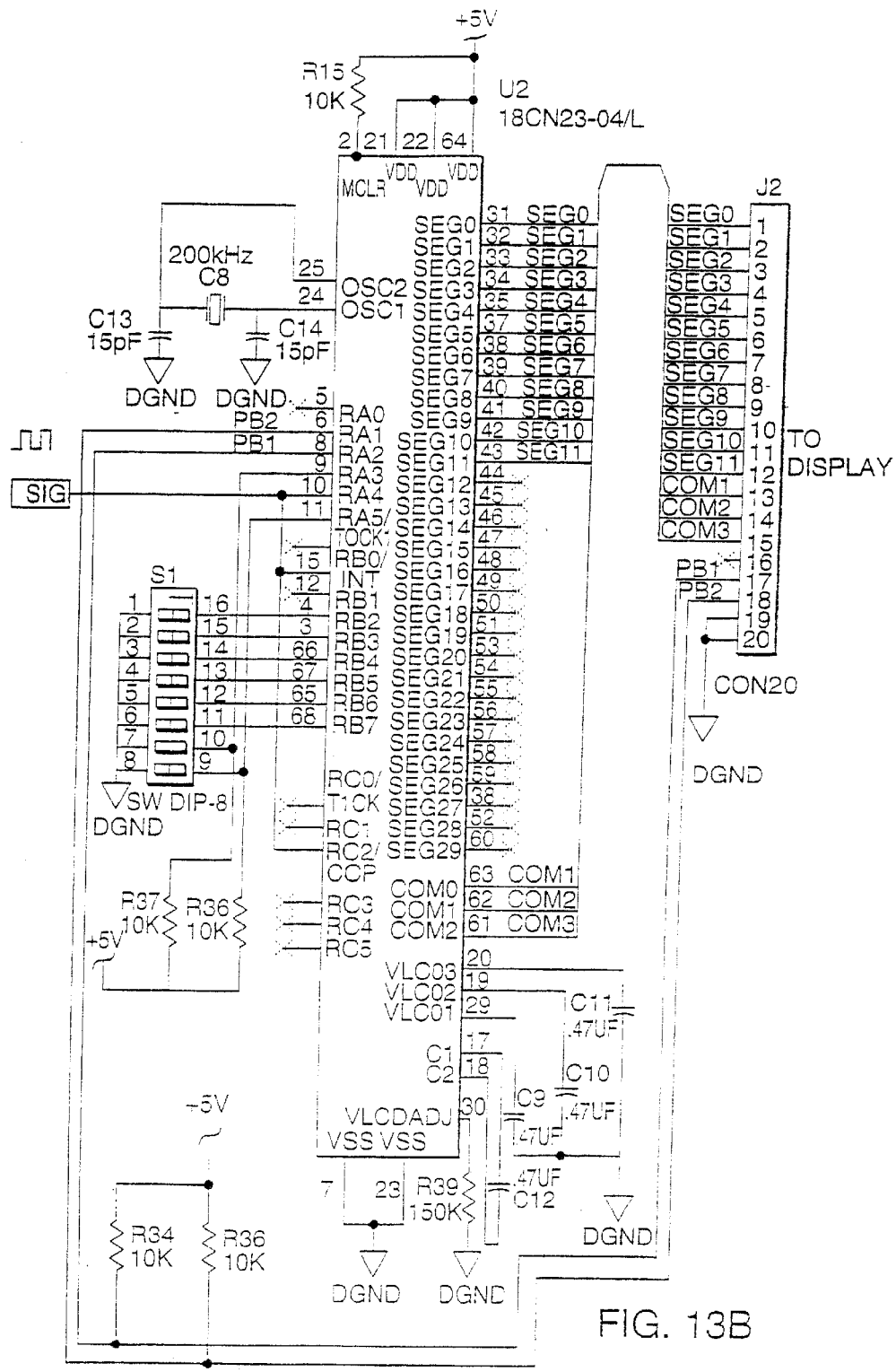
Figure 15A:
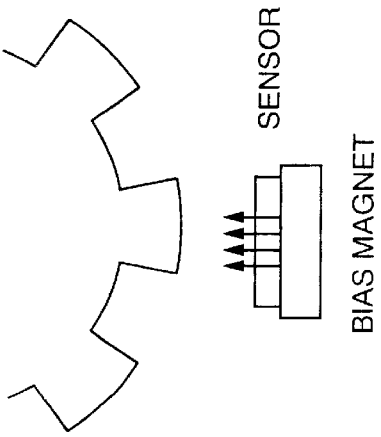
FIG. 15a and 15b include schematics of the principles of the passive magnetic sensor used in a conventional Gear-Tooth method for speed detection according to the invention.
Figure 15B:
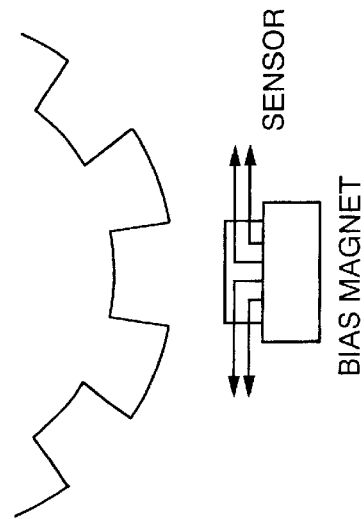
Figure 14:
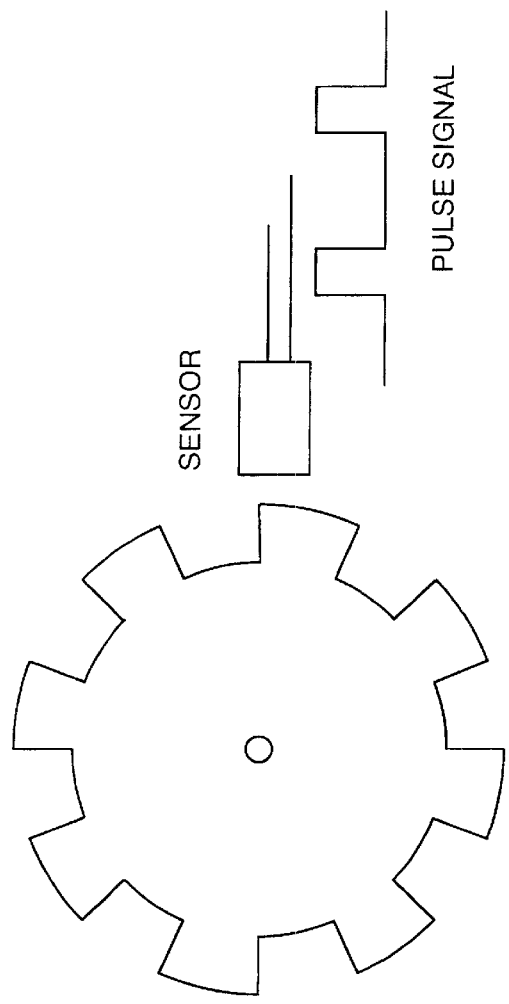
FIG. 14 is a schematic of a conventional Gear-Tooth method for generating pulse signals in magnetic sensors according to the invention.
Figure 16:
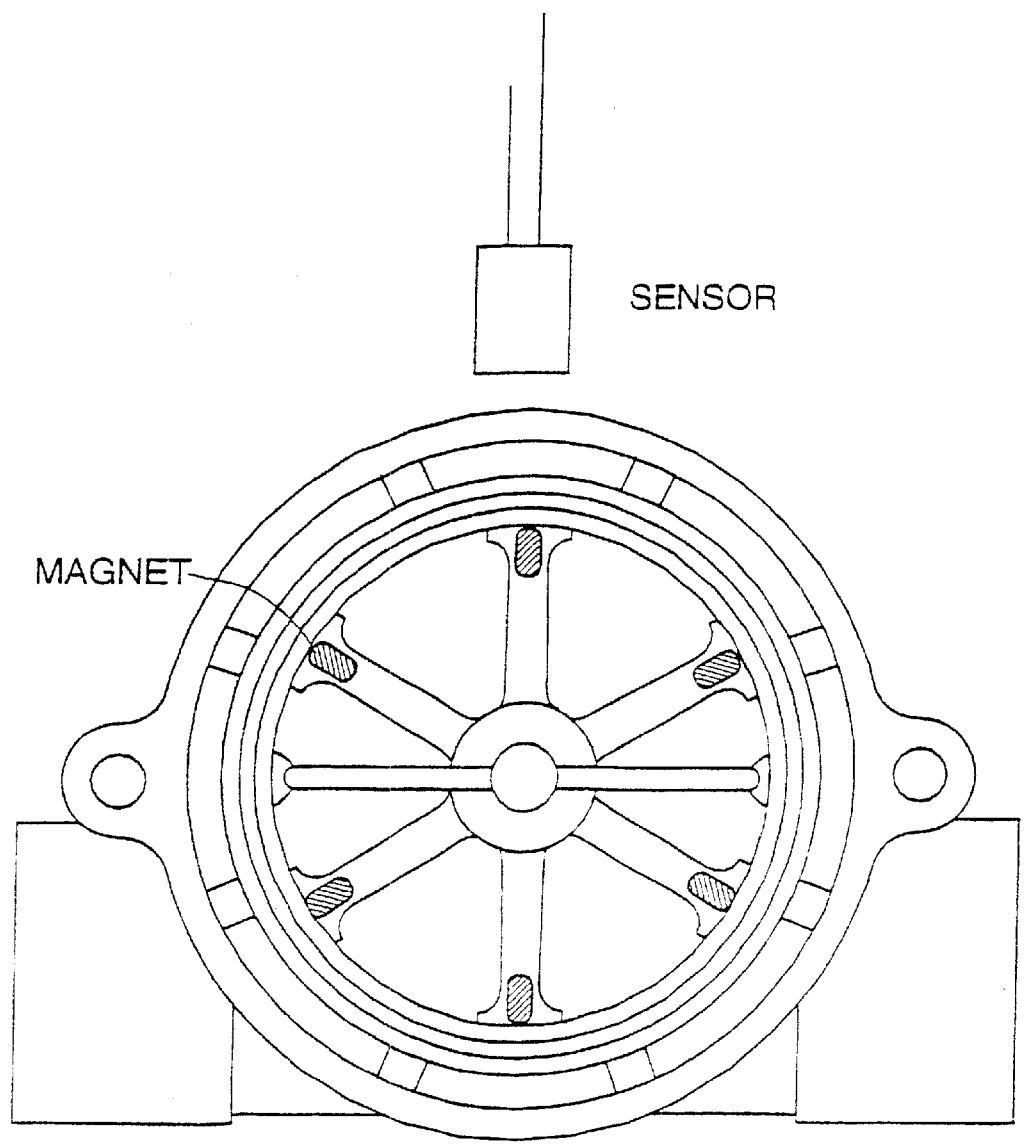
FIG. 16 is a schematic of the passive solid-state magnetic sensor used in metering liquid flow rates according to the invention.

One of the example-2 devices was used to demonstrate the detection of rotation speed. An aluminum plate mounted with six micro NdFeB magnets equally spaced at the edge, as shown in FIG. 12, was driven with a DC motor. A sine-wave magnetic field generated by this rotating aluminum plate was then detected by the sensor with an electrical sine-wave signal output. An electrical circuit, including impedance matching, wave modification, amplifying, pulse counting and displaying, was designed for the sensor as shown in FIGS. 13, 13a, and 13b. A square-wave pulse signal was measured from the circuit output. The number of the pulses was then counted within a minute, converted to the speed of the motor rotation, and displayed on the liquid crystal screen by the circuit. Software used in a microprocessor was also developed to calculate the time between the pulses and then to convert it to the frequency or revolution per minute (RPM). This approach eliminates the necessity of using sixty teeth gear for achieving resolution of one RPM. With this developed software we have built a tachometer which can read the speed from a wheel having only one magnet (one pulse per resolution) with a resolution of one RPM. In this configuration the sensor can be placed as far as 15 mm away from the rotating aluminum plate. We have also designed the sensor for ferromagnetic gears which are commonly used in the industry as shown in FIGS. 15a and 15b. A bias magnetic field was applied by placing a 1 cm-diameter ferrite permanent magnet in contact with the long side of a rectangular example-2 device. A commercial 24 pitch ferromagnetic gear was used. A schematic of magnetic field inside the sensor at tip and at valley of the gear is shown in FIG. 16. Although the sensor has to be placed within 5 mm of the gear, an electrical pulse signal was clearly detected and converted to the speed of the rotation by the same electrical circuit as shown in FIGS. 13a and 13b.

EXAMPLE 4

Figure 17:
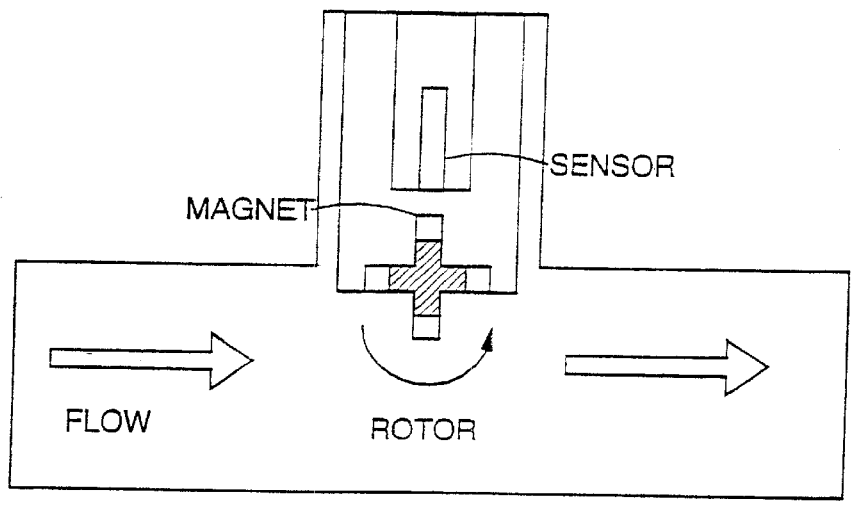
FIG. 17 is a schematic of flow sensor designed in use with Swedgelock and PVC fittings according to the invention.
Figure 18:
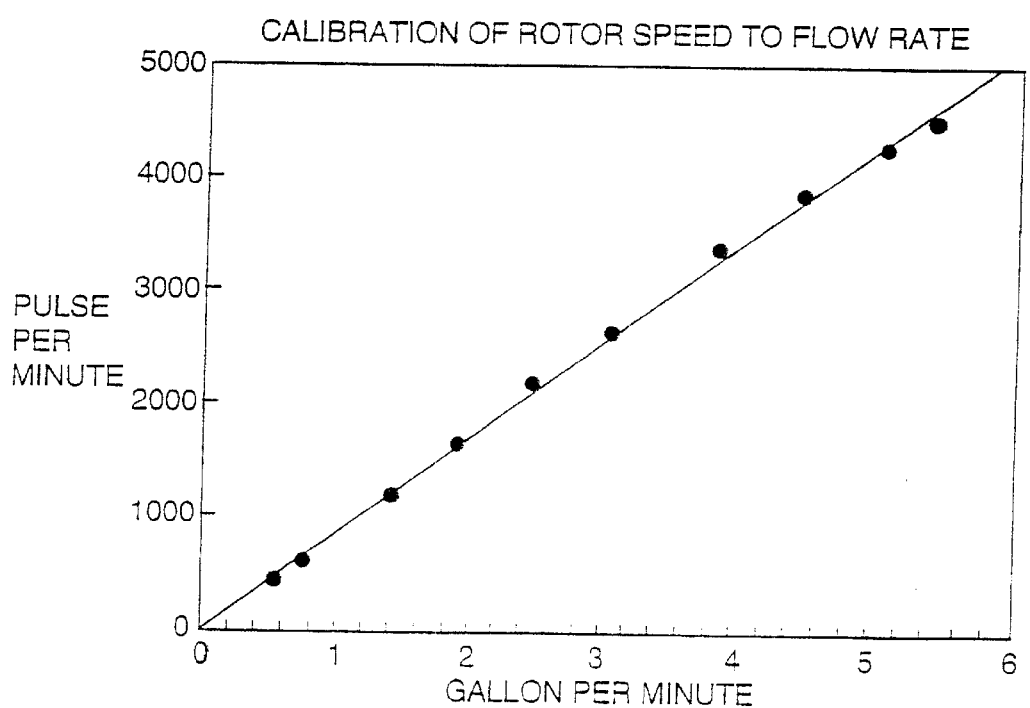
FIG. 18 shows rotor speed measured as a function of liquid flow rate by a piezoelectric magnetic sensor.

One of the example 2-sensors was also demonstrated for the application of measuring liquid flow rate. In this example a commercial water flow indicator was purchased and six micromagnets were placed on the tips of each blade as shown in FIG. 16. An magnetic sensor was attached to the outside of the flow indicator. The water flow rate was then measured as a function of the rotation speed of the blade inside the flow indicator. The calibration and the conversion of the flow rate unit is easily achieved by a microprocessor used in the electrical circuit shown in FIGS. 13a and 13b. We have also designed a flow sensor to fit the popular pipe fittings such as Swedglock Brass Tee and PVC Tee as shown in FIG. 17. A rotor with four miro NdFeB magnets mounted on four blades, respectively, are moving freely at the bottom of the flow sensor. A flow sensor is sealed inside the Tee at the optimized height which gives the maximum rotation speed at a certain flow rate. FIG. 18 shows a linear relationship between rotor speed and the liquid flow rate.

EXAMPLE 5

Figure 19:
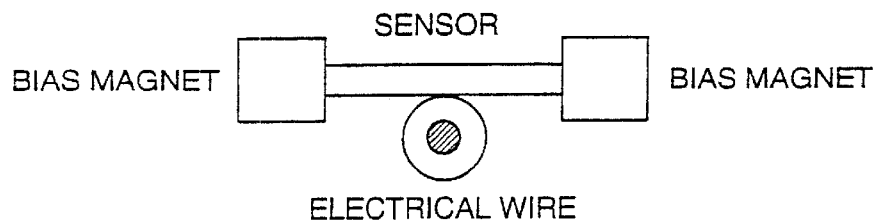
FIG. 19 is a schematic of electrical current measurement by a piezoelectric magnetic sensor according to the invention.
Figure 20:
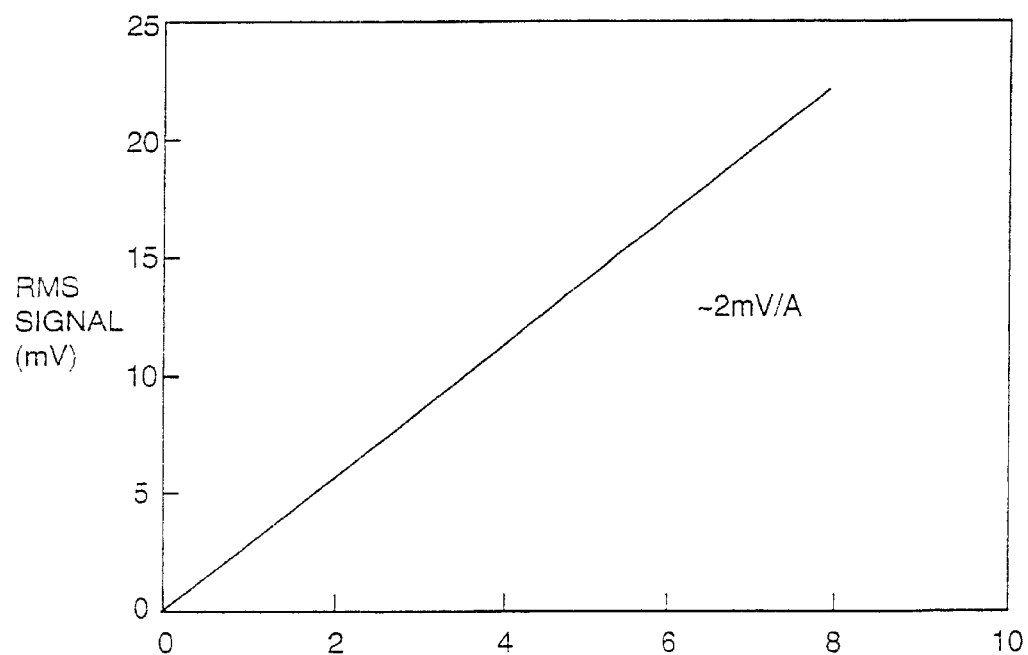
FIG. 20 shows the highly linear correspondence of piezoelectric signal output to electrical current.

One of the example-2 sensors was also demonstrated for measuring ac electrical current. A bias magnet was placed at each end of the sensor shown in FIG. 19. current. A bias magnet was placed at each end of the sensor shown in FIG. 19. The experiment was performed by placing a sensor on top of an electrical wire carrying a current from 1 to 10 A, and a raw signal was measured by an oscilloscope. The result plotted in FIG. 20 shows a linear relationship between the RMS signal and the current. The sensitivity is as large as 2 mV/A without amplification. The improvement of one order of magnitude higher sensitivity can be achieved by optimizing the material properties and the geometrical design. The linear fitting curve passing the origin point shown in the figure indicates the characteristic of the non zero-offset voltage for this current sensor in comparison with zero-offset voltage in the case of Hall effect and GMR current sensors. This advantage will lead to a simpler design of precision current sensors. A large dynamic range of the measurement can be achieved by selecting the magnetic materials and designing the sensors.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A system for detecting rotational speed of a rotor, the system comprising:
  a sensor comprising at least one multilayer material located adjacent to, but separate from, a rotatable rotor, the multilayer material comprising a layer of a first selected thickness of a selected magnetostrictive material, connected across an interface to a layer of a second selected thickness of a selected piezoelectric material and configured so that, when the magnetostrictive material is subjected to a change in magnetic field from rotation of the rotor, a change in at least one dimension of the magnetostrictive material induces a strain in, and produces a non-zero voltage signal in, the piezoelectric material, where the rotor comprises one or more selected magnetic materials located at N locations (N $\geq$ 1) on a circumference of the rotor, and the N locations are approximately equally spaced along the circumference; and
  voltage sensing means connected to the piezoelectric material layer to sense and count a number of times the voltage signal attains or exceeds a selected value in a selected time interval as the rotor wheel rotates.

2. A system as described in claim 1, wherein the multilayer material comprises a second layer of magnetostrictive material positioned so that the piezoelectric layer lies between and is connected to each of the first magnetostrictive layer and the second magnetostrictive layer.

3. A system as described in claim 1, wherein the multilayer material comprises a second layer of the piezoelectric material positioned so the layer of magnetostrictive material lies between and is connected to each of the first piezoelectric layer and the second piezoelectric layer, and at least one of the first piezoelectric layer and the second piezoelectric layer is connected to the voltage sensing means.

4. A system as described in claim 1, wherein the magnetic material is drawn from a group consisting of a ferromagnetic material and a permanent magnetic material.

5. A system as described in claim 1, wherein the magnetostrictive material is a ferrite.

6. A system as described in claim 1, wherein the piezoelectric material is drawn from a group consisting of lead zirconate titanate, polyvinylidene fluoride, aluminum nitride, and quartz.

7. A system as described in claim 1, wherein the piezoelectric material layer is patterned as a strip on the magnetostrictive material layer.

8. A system as described in claim 1, further comprising multiple strips of piezoelectric material connected in series.

9. A system as described in claim 1, wherein the rotor comprises N magnets (N $\geq$ 1) mounted on a circumference of the rotor with approximately equal spacing.

10. A system as described in claim 1, wherein the magnetostrictive material is a metal alloy.

11. A method for detecting rate of rotation of a wheel, the method comprising:
  providing a sensor with at least one multilayer material located adjacent to a circumference of a rotor wheel for a rotor, the multilayer material comprising a layer of a first selected thickness of a selected magnetostrictive material located contiguous to a layer of a second selected thickness of a selected piezoelectric material and configured so that, when the magnetostrictive material is subjected to a change in magnetic field, a change in at least one dimension of the magnetostrictive material induces a strain in, and produces a non-zero voltage signal in, the piezoelectric material, where the rotor comprises one or more selected magnetic materials located at N locations (N $\geq$ 1) on a circumference of the rotor, and the N locations are approximately equally spaced along the circumference; and
  providing a voltage sensing means, connected to the piezoelectric material layer, to sense and count a number of times the voltage signal attains or exceeds a selected value in a selected time interval as the rotor wheel rotates.

12. A system for detecting electrical current, the system comprising:
  an electrical conductor that can support an electrical current;
  at least one multilayer material, positioned adjacent to the conductor, the multilayer material comprising a layer of selected thickness of a selected magnetostrictive material located contiguous to a layer of selected thickness of a selected piezoelectric material and configured so that, when the magnetostrictive material is subjected to a change in magnetic field, a change in at least one dimension of the magnetostrictive material induces a strain in, and produces a non-zero voltage signal in, the piezoelectric material;
  a source of a bias magnetic field having a selected magnetic field strength in a region surrounding the multilayer material;
  a voltage sensing means, connected to the piezoelectric material layer, to determine a selected function value for the voltage in a selected time interval as electric charge flows in the conductor and to convert the voltage function value to a current value that is a measure of electrical current during the selected time interval.

13. The system of claim 12, wherein the voltage function value is chosen to be a root mean square value for said voltage, determined for said time interval.

14. A method for detecting electrical current, the method comprising:

provoking an electrical conductor that can support an electric current;

positioning at least one multilayer material adjacent to the conductor, the multilayer material comprising a layer of selected thickness of a selected magnetostrictive material located contiguous to a layer of selected thickness of a selected piezoelectric material and configured so that, when the magnetostrictive material is subjected to a change in magnetic field, a change in at least one dimension of the magnetostrictive material induces a strain in, and produces a non-zero voltage signal in, the piezoelectric material;

providing a bias magnetic field having a selected magnetic field strength in a region surrounding the multilayer material;

providing a voltage sensing means, connected to the piezoelectric material layer, to determine a selected function value for the voltage in a selected time interval as electrical charge flows in the conductor; and converting the voltage function value to a current value that is a measure of electrical current in the conductor during the selected time interval.

15. The method of claim 14, further comprising choosing as the voltage function value a root mean square value for the voltage, determined for the selected time interval.

* * * * *